United States Patent [19]

Van Goethem et al.

[11] 4,202,697

[45] May 13, 1980

[54] PRODUCTION OF ETCH-RESIST COLLOID AND MATERIAL SUITABLE THEREFOR

[75] Inventors: Hugo V. Van Goethem, Edegem; Marcel Stroobants, Muizen; Walter F. De Winter, S-Gravenwezel, all of Belgium

[73] Assignee: AGFA-GEVAERT N.V., Mortsel, Belgium

[21] Appl. No.: 910,333

[22] Filed: May 30, 1978

[30] Foreign Application Priority Data

Jun. 1, 1977 [GB] United Kingdom ............... 23203/77

[51] Int. Cl.$^2$ ........................ G03C 5/00; G03C 1/68
[52] U.S. Cl. ................................ 430/306; 204/159.12; 252/304; 252/316; 430/285
[58] Field of Search .................. 96/115 R, 115 P, 36, 96/35.1, 36.3; 204/159.12; 252/304, 316

[56] References Cited

U.S. PATENT DOCUMENTS

| | | | |
|---|---|---|---|
| 3,074,869 | 1/1963 | Workman | 96/115 R X |
| 3,558,309 | 1/1971 | Laridon et al. | 96/35.1 R X |
| 3,558,311 | 1/1971 | Delzenne et al. | 96/36.3 |
| 3,592,646 | 7/1971 | Holstead et al. | 96/115 R X |
| 3,682,642 | 8/1972 | Laridon et al. | 96/115 R |
| 3,718,473 | 2/1973 | Gerlay et al. | 96/35.1 X |

*Primary Examiner*—Edward C. Kimlin
*Attorney, Agent, or Firm*—A. W. Breiner

[57] ABSTRACT

A radiation-sensitive material is described that comprises a hydrophilic colloid layer containing a dispersed phase of at least one radiation sensitive polymer the polymer chain of which comprises units with side substituents containing oxime ester groups. Upon image-wise exposure to actinic radiation the polymer in the exposed areas reduces the permeability of the hydrophilic colloid layer for an etchant in the absence of any ethylenically unsaturated monomer. The layer having upon image-wise exposure to radiation image-wise differentiations in permeability for an etchant can be used as etch-resist, without needing a washing away step, to modify image-wise the surface of an element e.g. to produce printed circuits or printing forms.

13 Claims, No Drawings

PRODUCTION OF ETCH-RESIST COLLOID AND MATERIAL SUITABLE THEREFOR

The present invention relates to a method and materials for producing image-wise modified elements. This method and materials can be used e.g. in the production of printed circuits, in photochemical tooling, in the production of printing forms etc. According to this method the surface of an element or the element itself is modified image-wise. The image-wise modification of an element or of its surface in conformity with an image-wise exposure occurs by means of an etchant, whose action is image-wise controlled by means of an etch-resist.

Various kinds of etch resists are known. In the preparation of printing forms especially the preparation of gravure printing forms, the etch resist controls image-wise the action of the etchant so that the surface of the underlying printing member is modified image-wise so as to obtain more or less depressed areas.

The depressed areas or cavities will receive the printing ink, which ink is transferred from these cavities or ink cells to the printing stock. The transfer of ink to the printing stock is e.g. due to the suction of the printing stock, the adhesion power and/or viscosity of the ink etc.

The etch resist controlling the action of the etchant on the underlying printing member may consist e.g. of a hardened relief pattern. The thinner said pattern, the more intense the etching, in other words the deeper the etchant attacks the element to be etched.

The overwhelming part of gravure printing is performed with the aid of carbon tissue or pigment paper. Carbon tissue or pigment paper comprises a gelatin layer, which is made sensitive to ultra-violet light by means of an aqueous solution of alkali- or ammonium dichromate. After careful drying, the so-called "dichromated gelatin" layer is exposed e.g. through a continuous tone image and a gravure screen. The gelatin hardens in conformity with this exposure. The carbon tissue is then adhered to the printing surface, while pressure and moisture are applied. By the action of water the gelatin layer swells and firmly adheres to the printing surface, which had been hydrophilized beforehand. Subsequently, the unexposed and thus unhardened gelatin is washed away with warm water, whereas the printing element remains covered with an exposed and hardened etch resist forming a gelatin relief pattern. At this stage an etchant can be applied. The action of such etchant on the underlying printing element is proportional to the thickness of said relief pattern.

The quality of the printing form made by means of carbon tissue highly depends upon the skill of the working personnel and on the working conditions such as the temperature and the relative humidity. Moreover, pigment paper has two very important drawbacks, first the "dark reaction", which initiates the hardening of the gelatin without any exposure and secondly the continued hardening of the exposed "dichromatic gelatin", even when the exposure has ceased. In spite of these drawbacks, gravure printing based upon carbon tissue provides good printing quality, viz. high density printing values, good tone rendering, high runs, and consistent colour reproduction.

Because of the dependency on many variables it is necessary to simplify the preparation of gravure printing forms. It has been proposed therefore to use more consistent products and methods. For example in the U.S. Pat. No. 2,760,863 of Louis Plambeck Jr. issued Aug. 28, 1956, a material is described, which comprises a layer consisting of a homogeneous mixture of a photopolymerisable ethylenically unsaturated monomer, a photoinitiator, and a binder. Upon image-wise exposure the monomers in the homogeneous mixture polymerize image-wise, whereas the unexposed areas remain unpolymerized. The unexposed areas are washed away.

Homogeneous mixtures of photopolymerizable monomers and of a photoinitiator in a binder are extremely sensitive to polymerization inhibiting phenomenons caused by oxygen.

To overcome oxygen inhibition as occurs in the photopolymerization of photopolymerizable monomers homogeneously mixed with a photoinitiator in a hydrophilic colloid binder it has been proposed in the U.S. Pat. No. 3,418,118 of Glen Anthony Thommes and Peter Walker issued Dec. 24, 1968, to use a heterogeneous dispersion of photopolymerizable monomer and of photoinitiator in a hydrophilic colloid binder.

In the U.S. Pat. No. 3,718,473 of Joseph Edmund Gervay and Peter Walker issued Feb. 27, 1973 a material for forming an etch resist is described which comprises a hydrophilic colloid layer including a dispersed phase of an ethylenically unsaturated monomer and a free-radical photoinitiator. Upon image-wise exposure, image-wise photopolymerization takes place so that the diffusibility of an etchant through the binder layer is reduced image-wise. The image-wise polymerization of this material changes the chemical and physical behaviour of the heterogeneous layer. In the process according to the above-mentioned patent specification there is no need to wash away the unpolymerized monomers.

In the above procedures of making etch resists based on the photoinitiated polymerization of ethylenically unsaturated monomers all kinds of photoinitiators can be used.

Non-polymeric as well as polymeric compounds containing oxime ester groups are known from U.S. Pat. No. 3,558,309 of Urbain Leopold Laridon and Gerard Albert Delzenne issued Jan. 26, 1971 for use as photoinitiator in the photopolymerization of ethylenically unsaturated monomers and to make etch resists with the washing-away step according to the method of the above U.S. Pat. No. 2,760,863. These photoinitiators can of course also be used in the procedure of the above U.S. Pat. No. 3,718,473 without washing away step.

According to U.K. Pat. No. 1,180,845 filed Aug. 8, 1967 by Gevaert-Agfa N.V., etch resist can be made by image-wise photodegradation of polymers containing oxime ester groups and washing away the decomposed polymer in the exposed areas by means of solvents in which the nondecomposed polymer in the unexposed areas is insoluble.

Surprisingly, it has been found that a hydrophilic colloid layer containing a dispersed phase of a polymer with recurring units containing oxime ester groups in the side-chain can be used to form an etch resist, through which after image-wise exposure an etchant diffuses image-wise, without the need of a washing away step before the application of the etchant and without the presence of an ethylenically unsaturated monomer in the layer.

The present invention thus provides a process for image-wise modifying the surface of an element by making an etchant diffuse through a layer applied to said surface, this layer forming an etch resist with image-wise differentiations in permeability for an etchant. The said etch resist is formed by the steps of image-wise exposing to actinic radiation a layer of a hydrophilic colloid binder containing, in the absence of any ethylenically unsaturated monomeric material, a dispersed phase of at least one radiation-sensitive polymer, the polymer chain of which comprises units with side-substituents containing oxime ester groups. By the exposure to actinic radiation the permeability of the layer for an etchant is reduced in conformity with said exposure.

The phenomenons taking place in the process of the present invention are believed to be the following. The hydrophilic binder medium wherein a polymer, whose polymer chain comprises units with side-substituents containing oxime ester groups, is heterogeneously dispersed, constitutes the medium, through which an etchant e.g. an Fe(III)chloride solution can diffuse in consequence of the capillary behaviour of said medium. Upon exposure to actinic radiation the oxime ester units in said polymer form radicals which crosslink with the hydrophilic binder medium so that the capillarity of the layer is reduced and thus the permeability of the layer for a hydrophilic etchant is reduced.

By the term oxime ester group is meant an O-acyloxime group of the formula $>C=N-O-CO-R$ wherein R is an organic group.

Particularly suitable polymeric compounds having side-substituents comprising an oxime ester group are polymers obtained by (1) the reaction of a monooxime of an α,β-diketone e.g. 1-phenyl-1,2-propanedione-2-oxime, 1-(p-hydroxyphenyl)-1,2-propanedione-2-oxime, p-hydroxyphenyl glyoxalaldoxime and 2,3-butanedione monooxime with an ethylenically unsaturated acid chloride e.g. acryloyl or methacryloyl chloride and polymerization or copolymerization of the thus formed monomer carrying an oxime ester group, or (2) the reaction of an ethylenically unsaturated compound comprising an α,β-diketo monooxime, with a carboxylic acid chloride which includes an aliphatic, aromatic or heterocyclic acid chloride e.g. acetylchloride, propionylchloride, benzoylchloride, p-nitrobenzoyl chloride, o-methoxybenzoyl chloride, o-chlorobenzoyl chloride, 2-methyl-3-indolizine carbonyl chloride, etc., and polymerization or copolymerization of the thus formed monomer carrying an oxime ester group. These polymers are thus polymers or copolymers of monomers corresponding to the formula

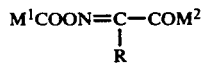

wherein one of M¹ and M² is or comprises an ethylenically unsaturated group and the other is an aliphatic, aromatic or heterocyclic group e.g. alkyl including substituted alkyl or aryl including substituted aryl and R represents hydrogen, alkyl including substituted alkyl or aryl including substituted aryl.

Particularly suitable polymers are those comprising recurring units corresponding to one of the following general formulae I and II:

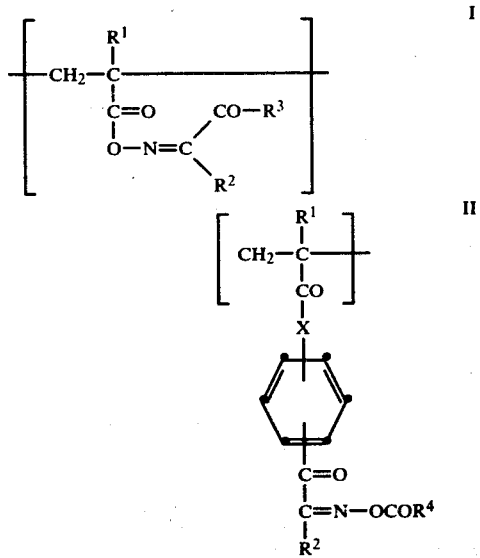

wherein:
$R^1$ is hydrogen or $C_1-C_5$ alkyl e.g. methyl,
$R^2$ represents hydrogen, alkyl including substituted alkyl or aryl including substituted aryl,
$R^3$ represents alkyl including substituted alkyl, aryl including substituted aryl,
X represents —NH— or —O—, and
$R^4$ represents an aliphatic, aromatic, or heterocyclic group.

The polymers used according to the present invention can be homopolymers or copolymers. They are preferably copolymers comprising besides the units with oxime ester group in the side chain units derived from a variety of monomers, whereof preferably at least one is hydrophobic. Examples of comonomers are (meth)acrylamide, N-alkyl(meth)acrylamide, alkyl(meth)acrylate, styrene, acrylonitrile, N-vinylpyrrolidone, vinyl acetate and other vinyl esters. Preferred copolymers comprise from 5 to 50 mol % recurring units with oxime ester groups in the side chain.

Representative examples of monomers from which the polymers used according to the invention can be derived are:

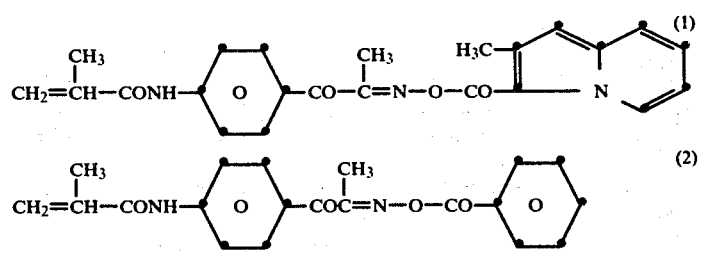

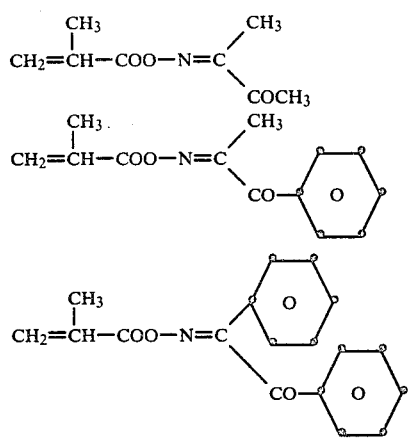

(3)

(4)

(5)

Preparation of the latter three monomers and polymerization thereof is illustrated in U.K. Pat. No. 1,180,845, already mentioned hereinbefore.

The following preparations illustrate how monomers (1) and (2) are prepared.

PREPARATION 1: MONOMER (1)

(a) p-propionyl-acetanilide 1290 g of aluminium chloride (9.6 mole) were suspended with stirring in 1500 ml of carbon disulphide. 405 g of acetanilide (3 moles) were added slowly to this suspension, while the temperature was kept at 25° C. The reaction mixture was heated until reflux and was cooled immediately to 25° C. 565 ml of propionyl chloride (6.5 moles) were added dropwise in such a way that the temperature was kept at 25° C. The reaction mixture was heated until reflux for 5 hours and kept overnight at ambient temperature (20° C.). The supernatant carbon disulphide layer was decanted and the remaining viscous mixture was poured in a mixture of ice and hydrochloric acid. The residue formed was filtered off and further recrystallized from a mixture of 1500 ml of ethanol and 75 ml of water. Drying was applied under vacuum at 100° C. A light yellow powder was obtained.

Yield: 400 g.
Melting point: 165° C.

(b) p-propionyl aniline 141 g (1 mole) of p-propionylacetanilide were dissolved while refluxing and stirring into 600 ml of 5 N hydrochloric acid. Refluxing was continued for 30 min, cooling was applied, and sodium carbonate (about 300 g) was added, until the reaction mixture was alkaline. The residue formed was sucked off, washed with water until neutral and recrystallized from 725 ml of isopropanol. The mixture was sucked off and washed with ether. After drying under vacuum, a yellow-brownish powder was obtained.

Yield: 126 g (85%).
Melting point: 138° C.

(c) N-p-propionylphenyl-methacrylamide 149 g (1 mole) of p-propionylaniline were dissolved in 1250 ml of dioxan with stirring and heating.

The solution was cooled to 25° C. and 92.4 g of sodium hydrogen carbonate (1.1 mole) were added.

A small amount of m-dinitrobenzene and copper(II) acetate were added whereupon a solution of 124.5 g of methacrylyl chloride (1 mole) in 125 ml of dioxan were added dropwise. The temperature was kept at 20°-25° C. Stirring was then continued for 30 min whilst slowly heating until reflux. Light yellow needles were sucked off, washed with ether, and dried under vacuum.

Yield: 30 g.
Melting point: 132° C.

The filtrate was evaporated to ¼ of its volume and the residue was sucked off, washed with ether, and dried under vacuum. Another 67 g of light-yellow needles melting at 132° C. were obtained.

(d) compound of the formula

217 g (1 mole) of N-p-propionylphenyl-methacrylamide were dissolved in 1500 ml of trichloromethane with stirring and slight heating.

The mixture was cooled to ambient temperatures (20° C.). Dry hydrogen chloride was introduced for 15 min and simultaneously a solution of 200 ml of n-amyl nitrate in 200 ml of trichloromethane were added dropwise. The temperature was kept between 20° and 26° C. Subsequently, hydrogen chloride was introduced for another 15 min with stirring. The resulting mixture was allowed to stand overnight. The residue formed was sucked off and dried under vacuum. A light-yellow powder was obtained.

Yield: 205 g (83%).
Melting point: 210° C.

This product may be purified by dissolving in a 10% aqueous solution of sodium hydroxide and again forming a residue with HCl or by recrystallization from a mixture of ethanol and water (2:1).

(e) 2-methylindolizine

A mixture of 92.5 g monochloroacetone (1 mole) and 93 g of α-picoline (1 mole) was heated for 2½ h on a boiling water-bath. The reaction mixture was cooled to ambient temperature (20° C.) and kept overnight. A solid black mass formed. Extraction was performed on a hot water-bath until the mass had dissolved completely (about 700 ml). The solution was filtered and washed 3 times with 100 ml of ether. A few ml of an aqueous saturated sodium carbonate solution were added and the solution was then washed again 4 times in ether. 150 g of solid sodium hydrogen carbonate was added carefully and steam distillation was carried out. The distillate was cooled and sucked off. The solid product was dissolved quickly in ether and dried on heated magnesium sulphate. The ether was evaporated and the residue dried.

Yield: 165 g (65%).
Melting point: 65° C.

After steam distillation the product was to be shielded from light.

(f) 2-methyl-indolizine-3-carbonyl chloride

A solution of 99 g of phosgene (1 mole) in 800 ml of anhydrous toluene was cooled beneath 15° C. While the reaction mixture was cooled and stirred a solution of 131 g of methylindolizine (1 mole) in 475 ml of anhydrous toluene was added dropwise. The reaction mixture was kept overnight and the residue formed was sucked off.

The filtrate was evaporated to dryness and the residue was recrystallized from 1 liter of anhydrous hexane. The mixture was sucked off and dried under vacuum. Yellowish-green needles were obtained.

Yield: 97 g (50%).
Melting point: 71° C.

The product was stable for some weeks at 0° C.

(g) monomer 1

4.92 g (0.02 mole) of the compound of step (d) were dissolved with stirring in 25 ml of 1 N sodium hydroxide.

A small amount of triphenylmethylarsoniumiodide was added and the mixture was cooled in ice-water until the temperature was between 0° C. and 5° C. A solution of 3.87 g (0.02 mole) of 2-methyl-indolizine-3-carbonyl chloride (step f) in 50 ml of methylene chloride was added dropwise in 5 min.

Stirring was continued for 30 min at 0°-5° C. and subsequently at ambient temperature for 2 h. During this operation the pH was checked continuously. The reaction mixture should remain strongly alkaline.

A supplemental amount of 50 ml of methylene chloride was added and the water layer was decanted.

The mixture was washed a few times with water and the methylene chloride layer was evaporated under vacuum. The residue was washed with a small amount of ether, sucked off, and dried under vacuum. A yellowish green powder was obtained.

Yield: 6.1 g (75%).
Melting point: 157° C.

The product should be shielded from light during and after the reaction. If necessary the product can be purified by recrystallization from a mixture of ethanol and water (90:10 by volume).

Elementary analysis: Calc. C 68.59, H 5.21, N 10.42. found C 66.35–65.95, H 5.10–5.00, N 10.00–10.05.

PREPARATION 2: MONOMER 2

Monomer 2 was prepared as monomer 1 (step g of preparation 1 using 2.81 g of benzoyl chloride).

The above monomers can be homopolymerized or copolymerized to form polymers with recurring units containing an oxime ester group in the side chain as is illustrated in Research Disclosure June 1973, Havant, England, Disclosure No. 11048 and by the following preparations.

Preparation 3: Copolymer of methylmethacrylate and monomer 2

3 g of azobis-isobutyronitrile were added to a solution of 70 g of monomer 2 and 80 g of methyl methacrylate (0.8 mole) in 750 ml of dimethylformamide. The solution was stirred under nitrogen atmosphere at 75° C. for 24 hours. The viscous solution was allowed to form a residue in methanol and the polymer obtained was separated and sucked off under vacuum.

During and after the reaction the product was shielded from light.

Yield: 135 g (90%). $[\eta]_{THF}=0.15-0.20$.

The molar ratio of methylmethacrylate units to monomer units 2 was 81:19.

Preparation 4: Copolymer of methylmethacrylate and monomer 1

3 g of azobis-isobutyronitrile were added to a solution of 40.45 g of monomer 1 (0.15 mole) and 85 g of methyl methacrylate (0.85 mole) in 750 ml of dimethylformamide. The solution was stirred in nitrogen atmosphere at 75° C. for 24 h. The viscous solution was allowed to form a residue in methanol and the polymer obtained was sucked off and dried under vacuum. The product was shielded from light during and after the reaction.

Yield: 123 g. $[\eta]_{THF}=0.10$.

The molar ratio of methylmethacrylate units to monomer units 1 was 85:15.

The resist-forming layer used according to the present invention comprises dispersed in a hydrophilic colloid binder in the absence of any ethylenically unsaturated monomeric material, at least one radiation sensitive polymer comprising units with oxime-ester groups as side substituents.

The hydrophilic colloid used as the binder for the dispersed polymer particles is preferably gelatin, but other hydrophilic colloids can also be used, e.g. colloidal albumin, alginic acid and derivatives thereof, a cellulose derivative e.g. carboxymethylcellulose and hydroxyethylcellulose, a synthetic hydrophilic colloid such as polyvinyl alcohol, poly-N-vinyl pyrrolidone, copolymers of acrylic acid, polyacrylamides and derivatives, etc. If desired, compatible mixtures of two or more of these colloids can be employed for dispersing the polymer particles.

The weight ratio of hydrophilic colloid to polymer is preferably comprised between 20:1 and 1:1.

The radiation-sensitive polymers can be dispersed in the hydrophilic colloids using any of the dispersion techniques known for incorporating photographic ingredients e.g. colour couplers in silver halide emulsion layers. A particularly suitable technique is to disperse the polymers from solutions in high-boiling water-immiscible solvents or mixtures of high-boiling and low-boiling water-immiscible solvents, in aqueous solutions of the hydrophilic colloid. Examples of such high-boiling solvents and tricresyl phosphate, dibutyl phthalate and other esters of organic dicarboxylic acids e.g. diethylmalonate, diethyloxalate, diethyl succinate, etc. In dispersing the polymer droplets in the aqueous colloid surfactants can be used which include anionic, non-ionic and amphoteric compounds, e.g. sodium alkylnaphthalene sulphonates, sodium lauryl sulphate, sulphonated derivatives of fatty acid amides, sodium dioctylsulphate, sodium isotetradecyl sulphate, sorbiton monolaurate, etc.

By the use of the high-boiling water-immiscible solvents the polymers are dispersed in the hydrophilic colloid medium in the form of oily droplets. The average diameter of these droplets may be comprised between 0.01 and 20 microns preferably between 0.05 and 5 microns.

It is also possible to disperse the polymers in the aqueous colloid compositions from solutions in low-boiling water-immiscible solvents and removing the solvent during or after dispersing by evaporation if necessary under reduced pressure.

The radiation sensitive resist-forming layer used according to the present invention may comprise in addition to the boiler and radiation sensitive polymer, compounds increasing the sensitivity e.g. Michler's ketone and analogous aromatic ketones which increase the spectral response especially in the range of 270 to 380 μm.

The layer may also comprise so-called "filler"-compounds that are substantially non light-sensitive and do not crosslink with the hydrophilic binder. Such filler compounds are e.g. co(ethylene glycol isophthalate/isopropylene glycol isophthalate 50:50), co(vinyl chloride/vinyl acetate/maleic acid anhydride), co(-vinyl acetate/vinyl chloride), co(vinyl chloride/vinyl acetate/maleic acid), polyvinyl-n-butyral, polyisobutyl methacrylate, polystrene, polymethyl methacrylate, cellulose acetate butyrate, co(styrene/butadiene), and an epoxy resin of bisphenol A and epichlorohydrin, marketed by Ciba-Geigy, Basel, Switzerland under the name of ARALDITE GY 250 being preferred.

The layer may also contain antioxidizing agents, coating aids, dyes, etc.

In order to visualize the differentation in diffusibility for an etchant of the radiation-sensitive layer after exposure it is possible to incorporate in the layer all sorts of radiation-sensitive compounds which change colour or produce a colour upon exposure. For this purpose it is preferred to use polymers with ketooxime groups as side-substitutents in recurring units that upon exposure to actinic radiation from coloured degradation products. An example of such polymer is the polymer of preparation 4 hereinbefore.

Visualization of the exposure phenomenons makes possible sensitometric evaluation and follow up of the subsequent etching. Moreover by colouring during exposure, sensitivity decreases by the filtering action and the graduation decreases which is favourable for continuous-tone reproduction.

The resist-forming radiation-sensitive layer can be applied to any substrate known in the art. Metal supports or supports coated with metals such as for example zinc, and especially aluminum are excellently suited as base materials for a planographic printing plate. For the production of a planographic printing plate there may be likewise used specially treated sheets of paper or polymeric film supports coated with a metallic layer. For use in the production of intaglio or relief printing plates metal base materials suited for etching are used e.g. metal plates or cylinders of zinc, copper, steel or an etchable magnesium alloy. For use in the production of printed circuits the photoresist composition is applied e.g. to a supported copper layer, which can be easily etched.

The present radiation-sensitive layers can likewise be used in the production of microimages. For that purpose the photoresist coatings are applied to a relatively thin highly opaque black or gray metal coating that can be etched and serves as imaging layer. Suited metal coatings are made of tellurium or a tellurium alloy having a thickness in the range of 50 nm to 500 nm or bismuth coatings having a thickness in the range of 25 nm to 300 nm.

According to one embodiment in the composition of the metallic imaging layer tellurium alloys comprising at least 50 atomic percent of tellurium are used. Typical tellurium compositions, which are etchable with an opaque hypochlorite solution are described in U.S. Pat. Nos. 3,271,591 and 3,530,441 of Stanford R. Ovshinsky issued respectively Sept. 6, 1966 and Sept. 22, 1970.

According to another embodiment the imaging metal layer consists of bismuth. Bismuth possesses the advantage of directly adhering to organic resin supports such as a polyethylene terephthalate support when deposited thereon from bismuth vapour under reduced pressure conditions.

Vapour deposition techniques are sufficiently known to those skilled in the art e.g. of preparing photoconductive selenium coatings (see e.g. U.S. Pat. Nos. 3,874,917 of Charles Wood, John C. Schottmiller and Francis W. Ryan issued Apr. 1, 1975 and 3,884,688 of John C. Schottmiller, Francis W. Ryan and Charles Wood issued May 20, 1975).

For the etching of the bismuth layer preference is given to aqueous acidic iron (II) chloride solution. The concentration of iron (III) chloride is e.g. in the range of 5 to 20% by weight. Said solution contains preferably from 0.25 to 1% by weight of citric acid.

A likewise useful etching solution for the removal of bismuth is an aqueous solution containing 3 to 6% by weight of hydrogen peroxide and 5 to 10% by weight of sulphuric acid.

The radiation-sensitive layers according to the invention can be applied to the surfaces to be modified by any known coating technique e.g. by spin-coating, whirl coating, spraying, dip-coating, roller coating, air-knife coating, doctor-blade coating etc.

Instead of applying the radiation-sensitive layer directly to the surfaces to be modified they can be provided on a temporary support from which they can be stripped off if necessary by means of a stripping layer before or after exposure, and transferred to the surface to be etched. Preferred temporary supports are transparent film supports which permit exposure through the support. Examples of such transparent supports are cellulose nitrate film, cellulose ester film, polyvinyl acetal film, polystyrene film, polyethylene terephthalate film and related films of resinous materials. Other suitable temporary supports are paper and paper, which has been coated with α-olefin polymers, e.g. polyethylene, polypropylene, polyisobutylene-polyethylene mixtures etc.

It is possible to provide an antihalation layer between the radiation-sensitive layer and the temporary support e.g. between the stripping layer and the support or between the radiation sensitive layer and the stripping layer. It is also possible to provide the antihalation layer on the side of the transparent support opposite to that carrying the radiation-sensitive layer.

The exposure of the radiation-sensitive resist forming layer preferably occurs by means of UV-radiation sources e.g. carbon arcs and mercury vapour lamps. Exposure may occur through a contacted transparent master pattern or by a projection exposure.

The following examples illustrate the present invention.

EXAMPLE 1

An aqueous phase containing 60 g of gelatine, 340 g of water, 40 g of a 5% aqueous solution of the sodium salt of diisooctyl sulphosuccinate was prepared as follows: gelatin was allowed to swell for 1 h in water and then heated to 50° C., whereupon the other ingredients of the aqueous phase were added.

Next, an oily phase was prepared by dissolving 30 g of tricresyl phosphate, 3 g of Michler's ketone and 20 g of co(ethylene glycol isophthalate/isopropylene glycol isophthalate) (50:50) in 90 g of ethyl acetate and 90 g of m-xylene and then dissolving therein 40 g of the polymer of preparation 4.

The oily phase was emulsified in the aqueous phase by means of an homogenizer. Then 760 ml of water and 12.5 g of aqueous formaldehyde (4% by weight) were added to obtain the desired viscosity.

The emulsion was dip-coated on a polyethylene terephthalate support and dried. The thickness of the coated layer varied from 5 to 10 μm.

Preparation of the coating composition and coating occurred under darkroom illumination. The image-wise exposure was performed in contact in a vacuum frame in two stages. An exposure was carried out through a gravure screen of 65 lines per cm, in which the ratio of the dark lines to the transparent parts was 1:2.5.

Another exposure occurred through a continuous tone positive. The light source used was a mercury vapour lamp. The time relation between the continous tone exposure and the screen exposure was 0.66:1.

After the exposure, the etch resist layer showing a brown negative image was transferred by pressure to a wet copper surface. The polyethylene terephthalate support was stripped off and the etch resist was dried in the air.

The parts of the copper surface that were not covered by etch resist were coated with an asphalt derivative. The etching was performed with an iron (III) chloride solution of 39°–43° Baume for about 15 min.

The etching was stopped by abundantly rinsing with hot water. The etch resist was rubbed off easily. The resulting etch depths reached 3 to 45 μm. No undercutting was observed.

EXAMPLE 2

Example 1 was repeated with the difference that the aqueous phase contained:

gelatin: 90 g
water: 550 g
5% aqueous solution of the sodium salt of diisooctyl sulphosuccinate: 60 g and the oil phase contained:

ethyl acetate: 135 g
m-xylene: 135 g
tricresyl phosphate: 45 g
Michler's ketone: 4.5 g
co(ethylene glycol isophthalate/isopropylene glycol isophthalate (50:50): 30 g
polymer of preparation 3: 30 g
polymer of preparation 4: 3 g The oily phase was dispersed in the aqueous phase and after dilution as in example 1 coated on a polyethylene terephthalate support.

Exposure, transfer and etching occurred as described in Example 1.

We claim:

1. Process for image-wise modifying the surface of an element e.g. to produce a printing form by making an etchant diffuse through a layer applied to said surface, the said layer forming an etch resist with image-wise differentations in permeability for etchants characterized in that said etch resist is formed by the steps of image-wise exposing to actinic radiation a layer of a hydrophilic colloid binder containing in the absence of any ethylenically unsaturated photopolymerisable monomeric material, a dispersed phase of at least one radiation sensitive polymer the polymer chain of which comprises units with side substituents containing oxime ester groups, whereby the permeability of the hydrophilic colloid layer for an etchant is reduced in conformity with the image-wise exposure.

2. Process according to claim 1, wherein the said radiation-sensitive polymer is a homopolymer or copolymer derived from a monomer corresponding to the formula:

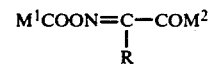

wherein:
one of $M^1$ and $M^2$ is or comprises an ethylenically unsaturated group, and the other is an aliphatic, aromatic or heterocylic group, and R represents hydrogen, alkyl including substituted alkyl, or aryl including substituted aryl.

3. Process according to claim 2, wherein the radiation-sensitive polymer comprises recurring units corresponding to one of the following formulae I and II:

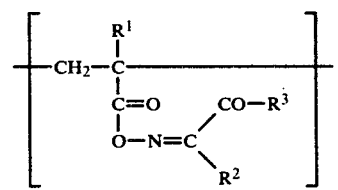

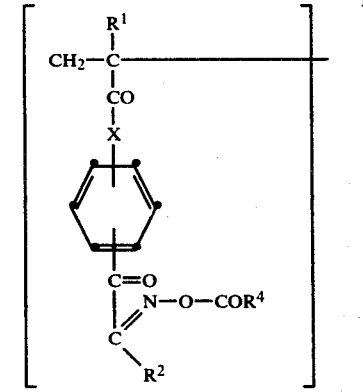

wherein:
$R^1$ is hydrogen or $C_1$–$C_5$-alkyl,
$R^2$ represents hydrogen, alkyl including substituted alkyl or aryl including substituted aryl, and
$R^3$ represents alkyl including substituted alkyl or aryl including substituted aryl,
X represents —NH— or —O—,
$R^4$ is an aliphatic, aromatic or heterocyclic group.

4. Process according to claim 1, wherein the polymer is a copolymer consisting from 5 to 50 mole % recurring units with oxime ester groups in the side chain.

5. Process according to claim 1, wherein the polymer is a copolymer comprising recurring alkyl(meth)acrylate units.

6. Process according to claim 1, wherein the ratio of hydrophilic colloid to radiationsensitive polymer is comprised between 20:1 and 1:1.

7. Process according to claim 1, wherein the etch-resist forming layer is applied to the surface to be modified after exposure of the said layer carried by a temporary support which is stripped off after transfer of the layer to the said surface to be modified.

8. A radiation sensitive material comprising a support and a hydrophilic colloid layer characterised in that the hydrophilic colloid layer contains, in the absence of any ethylenically unsaturated photopolymerisable monomeric material, a dispersed phase of at least one radiaion sensitive polymer the polymer chain of which comprises units with side substituents containing oxime ester groups, the said polymer being capable by exposure to actinic radiation of reducing the permeability of the hydrophilic colloid layer for an etchant.

9. Material according to claim 8, wherein the said radiation-sensitive polymer is a homopolymer or copolymer derived from a monomer corresponding to the formula:

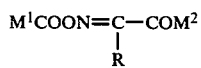

wherein:
one of $M^1$ and $M^2$ is or comprises an ethylenically unsaturated group, and the other is an aliphatic, aromatic or heterocylic group, and
R represents hydrogen, alkyl including substituted alkyl, or aryl including substituted aryl.

10. Material according to claim 8, wherein the polymer is a copolymer comprising from 5 to 50 mole % recurring units with oxime ester groups in the side chain.

11. Material according to claim 8, wherein the polymer is a copolymer comprising recurring alkyl(meth)acrylate units.

12. Material according to claim 8, wherein the ratio of hydrophilic colloid to radiation-sensitive polymer is comprised between 20:1 and 1:1.

13. Material according to claim 9 wherein the radiation-sensitive polymer comprises recurring units corresponding to one of the following formulae I and II:

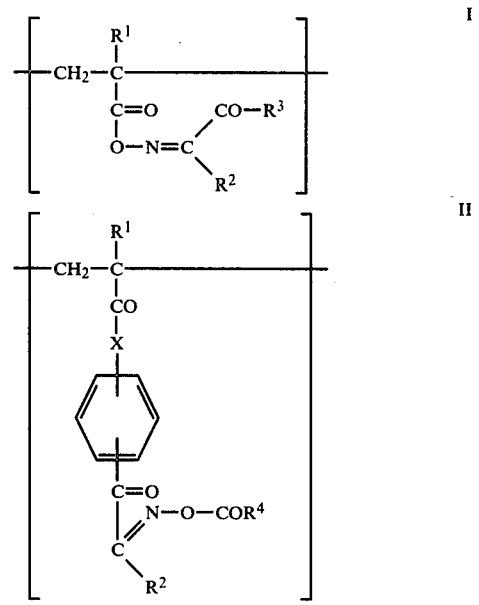

wherein:
$R^1$ is hydrogen or $C_1$–$C_5$-alkyl,
$R^2$ represents hydrogen, alkyl including substituted alkyl or aryl including substituted aryl, and
$R^3$ represents alkyl including substituted alkyl or aryl including substituted aryl,
X represents —NH— or —O—,
$R^4$ is an aliphatic, aromatic or heterocyclic group.

* * * * *

UNITED STATES PATENT AND TRADEMARK OFFICE
CERTIFICATE OF CORRECTION

PATENT NO. : 4,202,697

DATED : May 13, 1980

INVENTOR(S) : Hugo V. Van Goethem et al

It is certified that error appears in the above-identified patent and that said Letters Patent is hereby corrected as shown below:

Column 4, Lines 17-21, Formula II, part set forth as

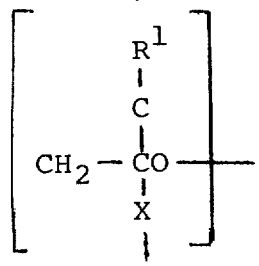   should read   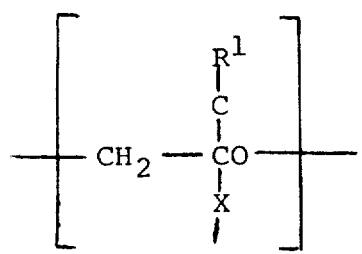

Column 6, Line 25, "30 g." should read -- 130 g. --

Column 6, Lines 34-36, part of formula set forth as

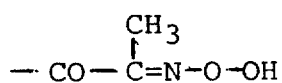   should read   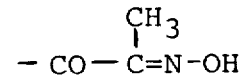

Column 6, Line 42 "temperatures" should read -- temperature --

Column 8, Line 59 "and" should read -- are --

Column 9, Line 14 "boiler" should read -- binder --

Column 9, Line 27 "polystrene" should read -- polystyrene --

UNITED STATES PATENT AND TRADEMARK OFFICE
CERTIFICATE OF CORRECTION

PATENT NO. : 4,202,697

DATED : May 13, 1980

INVENTOR(S) : Hugo V. Van Goethem et al

It is certified that error appears in the above-identified patent and that said Letters Patent is hereby corrected as shown below:

IN The Claims:

Column 12, Lines 45-50, part of formula II set forth as

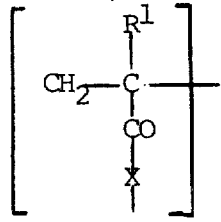   should read   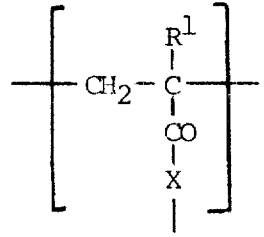

Column 13, Line 2 "consisting" should read -- comprising --

Column 13, Line 8 "radiationsensitive" should read -- radiation-sensitive --

Signed and Sealed this

Twentieth Day of September 1983

[SEAL]

Attest:

GERALD J. MOSSINGHOFF

Attesting Officer

Commissioner of Patents and Trademarks